(12) United States Patent
Bailey et al.

(10) Patent No.: US 7,308,761 B1
(45) Date of Patent: Dec. 18, 2007

(54) METHOD FOR PREPARING A GETTER STRUCTURE AND GETTER STRUCTURE

(75) Inventors: Michael C. Bailey, Santa Barbara, CA (US); David Van Lue, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 296 days.

(21) Appl. No.: 10/903,970

(22) Filed: Jul. 29, 2004

(51) Int. Cl.
*B21D 51/16* (2006.01)
*H01J 17/24* (2006.01)

(52) U.S. Cl. .......................... 29/890; 29/509; 417/48; 313/553; 445/31

(58) Field of Classification Search ................ 29/890, 29/509; 417/48; 313/553, 557, 560, 561; 445/31
See application file for complete search history.

(56) References Cited

U.S. PATENT DOCUMENTS

| | | | | |
|---|---|---|---|---|
| 2,824,640 A | * | 2/1958 | Della Porta | 417/48 |
| 2,907,451 A | * | 10/1959 | Della Porta | 417/48 |
| 3,023,883 A | * | 3/1962 | Meisen | 417/48 |
| 3,033,354 A | * | 5/1962 | Della Porta | 417/48 |
| 3,719,433 A | * | 3/1973 | Rabusin | 417/48 |
| 4,045,703 A | | 8/1977 | Mori et al. | |
| 4,145,162 A | * | 3/1979 | Schiabel | 417/48 |
| 4,308,650 A | | 1/1982 | Hernandez et al. | |
| 4,385,232 A | | 5/1983 | Woolgar | |
| 4,891,542 A | | 1/1990 | Mellor et al. | |
| 5,400,947 A | * | 3/1995 | Wang et al. | 228/124.5 |
| 5,404,072 A | | 4/1995 | Flanary et al. | |
| 5,509,045 A | | 4/1996 | Kautz | |
| 6,570,959 B1 | | 5/2003 | Kuzniar | |

FOREIGN PATENT DOCUMENTS

KR 200205993 A * 7/2002

* cited by examiner

Primary Examiner—Jermie E. Cozart
(74) Attorney, Agent, or Firm—Leonard A. Alkov

(57) ABSTRACT

A structure is prepared by preparing a getter assembly by furnishing a single-piece getter base including a getter substrate and a getter-shield precursor, affixing a getter material to the getter substrate, and processing the getter-shield precursor to form a getter shield. The processing is preferably performed by folding at least a portion of the getter-shield precursor to overlie the getter material affixed to the getter substrate. There may be provided a vacuum housing and a device. The getter assembly and the device are inserted into the vacuum housing, and the vacuum housing is evacuated and sealed.

16 Claims, 3 Drawing Sheets

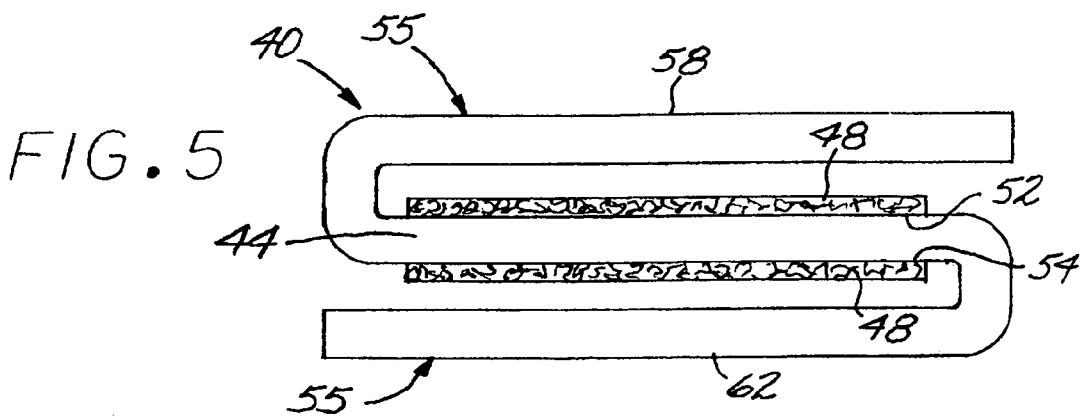
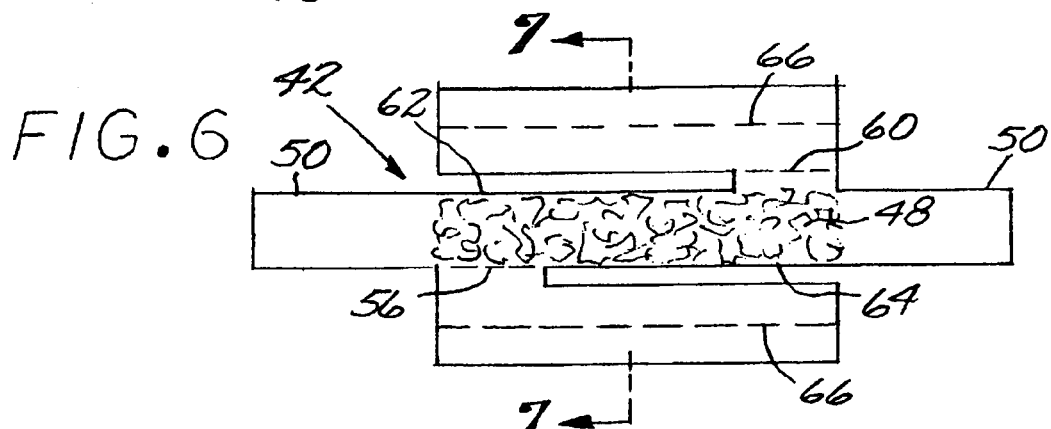
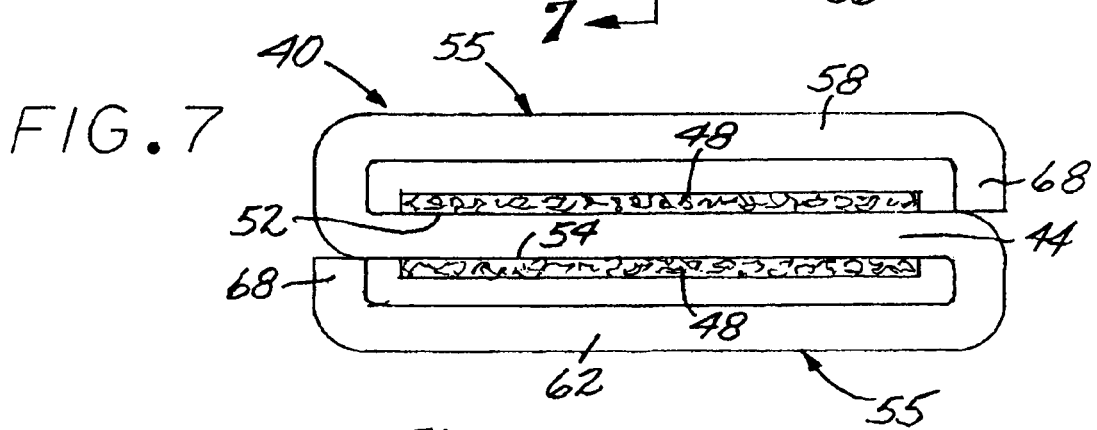
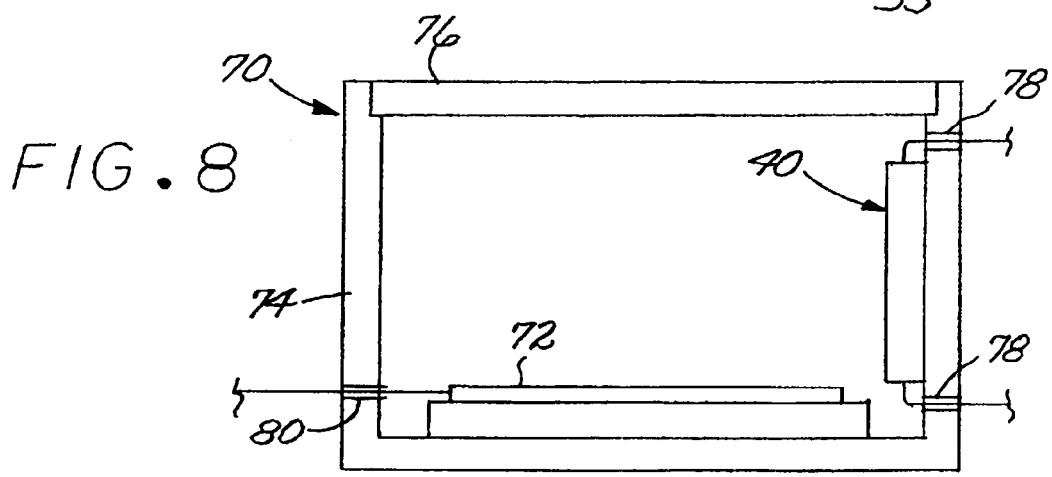

METHOD FOR PREPARING A GETTER STRUCTURE AND GETTER STRUCTURE

This invention relates to getter structures used in vacuum assemblies and, more particularly, to a getter structure having an integrated getter shield and its fabrication.

BACKGROUND OF THE INVENTION

In one type of vacuum assembly, a device of interest is hermetically sealed into the interior of a vacuum housing. The interior of the vacuum housing is evacuated, either during the sealing operation or subsequently through a vacuum line that is then sealed. The interior of the vacuum housing is not further evacuated by a pump during storage or service. Such sealed vacuum units are often used when the volume, weight, and/or power requirements of a pump that is available during storage and service are not consistent with the application.

During the sealing operation, during storage, or during service, additional gases may be evolved from the device or from the interior walls of the vacuum housing, or slowly leaked into the interior of the vacuum housing. The additional gases may include inorganic gases such as oxygen or nitrogen, or organic evolved gases. If these additional gases are allowed to continue to accumulate, their concentration may eventually become so great that the device may no longer be operable at the increased gas pressure, or other problems such as increased convective heat flow may arise.

One technique for reducing the concentration of the additional gases is to place a getter material that is highly reactive with the additional gases into the interior of the vacuum housing. As the additional gases are produced in the interior of the vacuum housing, the getter material chemically reacts, as by forming a solid reaction product, or physically reacts, as by adsorbing, the additional gases. The concentration and partial pressure of the additional gases remains low. An example of a known getter material is titanium.

The getter material is usually deposited upon a getter substrate. Typical getter materials must be activated by heating to a moderate activation temperature such as in the range of 500-900° C., before they can function to getter the additional gases. To accomplish the activation, the usual practice is to pass an electrical current through the getter substrate, ohmically heating the getter substrate and thence the getter material to the required activation temperature. During the elevated-temperature activation and even subsequently during service, some of the getter material may sputter or otherwise leave the getter and deposit upon other components such as the interior of windows or the device itself, interfering with their subsequent operation. Also, the radiant energy produced during the getter activation may heat and damage sensitive internal devices. To prevent such deposition of the getter material onto the other components and to prevent excessive heating by radiant energy during activation of the getter material, a getter shield may be positioned between the getter material and the other components, so that the evaporated getter material and the radiant energy fall on the getter shield rather than on the other components.

Available getter shields are relatively large in size and weight, and difficult to assemble with the getter assembly and the other components in the interior of the vacuum housing. The problem is of particular concern for miniaturized structures. There is accordingly a need for a better approach for preventing undesirable deposition of getter material on other components and excessive heating of other components in evacuated structures. The present invention fulfills this need, and further provides related advantages.

SUMMARY OF THE INVENTION

The present invention provides an improved getter structure with a minimally sized getter shield that prevents the deposition of getter material onto sensitive components and prevents radiant energy produced during getter activation from heating and damaging the other components. The present getter assembly may be readily scaled in size, and is convenient to use and to attach to other structure, even miniature structure.

In accordance with the invention, a method for preparing a structure comprises the steps of preparing a getter assembly by furnishing a single-piece getter base including a getter substrate and a getter-shield precursor, affixing a getter material to the getter substrate, and processing the getter-shield precursor to form a getter shield that overlies the getter material. The step of processing is desirably commenced after the step of affixing is completed. Preferably, the getter base is provided as a unitary structure formed of a single piece of material.

The step of processing is desirably performed by deforming the getter-shield precursor to form the getter shield. The deforming may be accomplished by folding at least a portion of the getter-shield precursor to overlie the getter material affixed to the getter substrate.

The getter substrate is preferably in the form of a sheet of material having two faces, a top face and a bottom face. In one embodiment, the getter material is affixed on only the top face of the getter substrate. The step of processing is commenced after the step of affixing is completed and includes the step of mechanically folding a top-shield portion of the getter-shield precursor to overlie the top face. In a second embodiment, the getter material is affixed to both the top face and the bottom face of the getter substrate. The step of processing is commenced after the step of affixing is completed and includes the step of mechanically folding a top-shield portion of the getter-shield precursor to overlie the top face and a bottom-shield portion of the getter-shield precursor to overlie the bottom face. In a third embodiment, a side-shield portion of the getter-shield precursor is mechanically folded to overlie the side.

The completed getter assembly is preferably inserted into a vacuum housing, along with a device such as a light sensor. The vacuum housing is then sealed and evacuated.

In its preferred form, a getter assembly has a single-piece getter base including a getter substrate region and a getter shield region. The getter material is supported on the getter substrate region. A getter shield is integral with the getter substrate and folded to overlie at least a portion of the getter material on the substrate. Other compatible aspects of the invention discussed herein may be used with the getter assembly.

The integral getter assembly is readily fabricated. A single piece of getter base sheet stock is cut to the required shape. The getter material is applied and affixed to the getter substrate portion of the getter base, by a technique such as screen printing. The getter shield precursor portion of the getter base is next folded to overlie the getter material, whether the getter material is on one face or both faces of the getter substrate, and optionally to overlie the sides of the getter substrate. This compact package is easily handled and easily attached to the interior of the vacuum housing. The size and weight of the getter shield are minimal, because of its close proximity to the getter material. Fabrication is inexpensive to perform.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 5 is a sectional view of the getter base of FIG. 4, taken on line 5-5, but after folding the getter-shield precursor;

FIG. 6 is a plan view of a third embodiment of the getter base prior to folding;

FIG. 7 is a sectional view of the getter base of FIG. 6, taken on line 7-7, but after folding the getter-shield precursor; and FIG. 8 is a longitudinal sectional view of a vacuum enclosure with the getter assembly and a device therein.

DETAILED DESCRIPTION OF THE INVENTION

Figure 1:
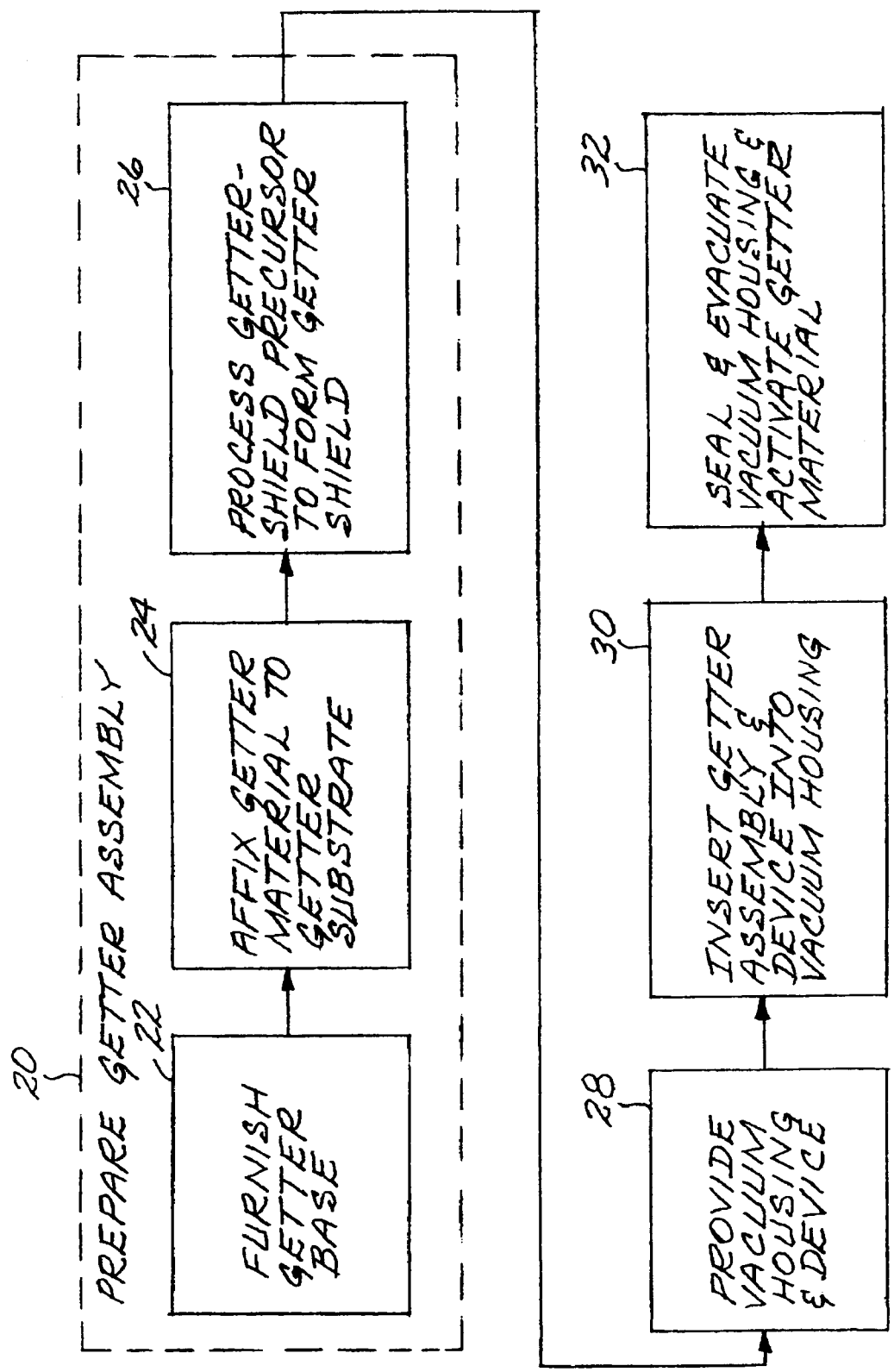
FIG. 1 is a block flow diagram of a method for preparing a structure.
Figure 2:
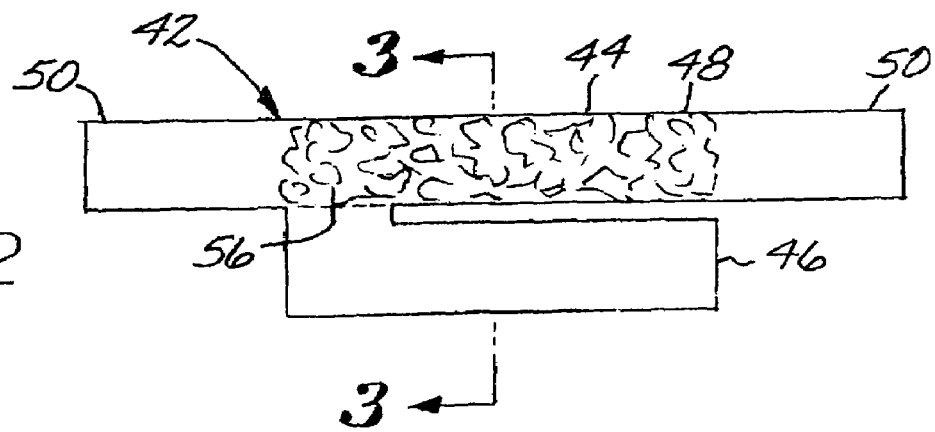
FIG. 2 is a plan view of a first embodiment of the getter base prior to folding.
Figure 3:
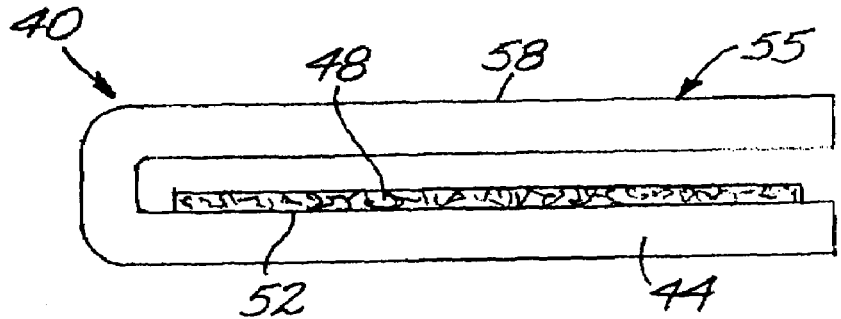
FIG. 3 is a sectional view of the getter base of FIG. 2, taken on line 3-3, but after folding the getter-shield precursor.
Figure 4:
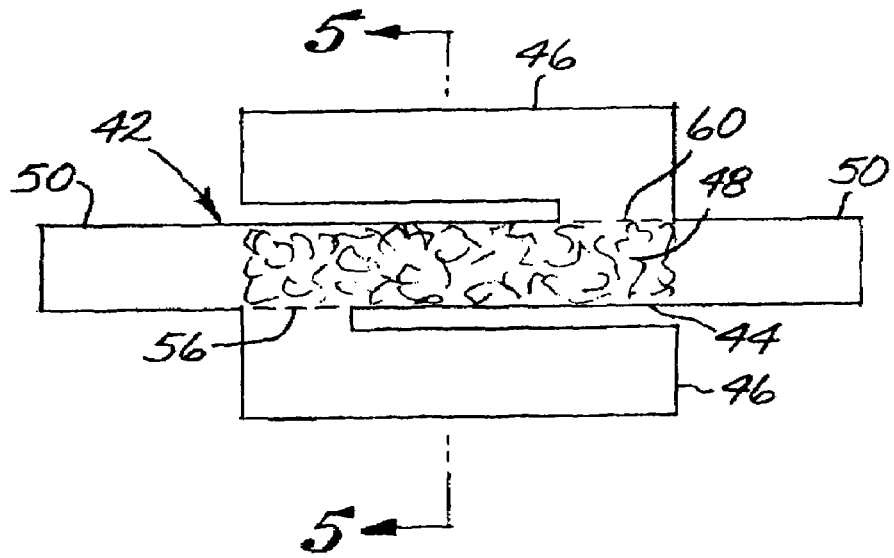
FIG. 4 is a plan view of a second embodiment of the getter base prior to folding.

FIG. 1 depicts the steps in a method for preparing a structure that includes a getter assembly. FIGS. 2, 4, and 6 depict three embodiments of the getter assembly at an intermediate stage of fabrication, and FIGS. 3, 5, and 7 depict the final getter assemblies 40 respectively for these three embodiments.

The method includes preparing a getter assembly 40, step 20. The step of preparing 20 includes the step of furnishing a single-piece getter base 42, step 22, preferably as a unitary structure formed of a single piece of material. (The single-piece getter base 42 could instead be formed by joining two base components.) In this approach, the getter base 42 is a thin sheet of a base material such as Nichrome, cut into a shape that defines two regions, a getter substrate 44 and a getter-shield precursor 46. (Nichrome has a basic composition of 80 percent by weight nickel and 20 percent by weight chromium, but small amounts of elements such as silicon, iron, and manganese may be present in some variations.) That is, the getter substrate 44 and the getter-shield precursor 46 are different regions of the single piece of material that is the getter base 42. The two regions 44 and 46 are assigned these designators so that they may be conveniently discussed in relation to their subsequent use. The getter substrate 44 is selected to be sufficiently large to support the required area of a getter material 48, with tabs 50 extending outwardly to serve as mechanical and electrical connections. The shape of the getter base 42 will be discussed in greater detail below.

The getter material 48 is affixed to the getter substrate 44, step 24. Any operable getter material 48 may be used. A preferred getter material 48 is titanium particles. Any operable method of applying and affixing the getter material 48 to the getter substrate 44 may be used, as appropriate for the selected getter material 48. Examples of operable application and affixing techniques include screen printing and sintering. For the preferred titanium getter material 48 and the preferred Nichrome getter base 42, the preferred application and affixing method 24 is screen printing or sputtering. The surface area of the getter material 48 and its thickness are selected according to the final application. In an example of the preferred application, 1 square centimeter of the getter material 48 is affixed to only a top face 52 of the getter substrate 44, as illustrated for the embodiments of FIGS. 2-3, or to both the top face 52 and a bottom face 54, as illustrated for the embodiments of FIGS. 4-5 and 6-7.

The getter-shield precursor 46 is processed to form an integral getter shield 55 overlying at least a portion of the getter material 48, step 26 of FIG. 1. The processing step 26 is normally commenced only after the affixing step 24 is completed, as illustrated for the present embodiments, but in some cases the processing step 26 may be performed at least in part prior to the affixing step 24, or in part concurrently with the affixing step 24. The processing step 26 is preferably performed by deforming the getter-shield precursor 46, as by folding at least a portion of the getter-shield precursor 46 to overlie the getter material 48 affixed to the getter substrate 44. The shape in which the getter base 42 is first prepared, as shown in FIGS. 2, 4, and 6 for the three illustrated embodiments, is selected to facilitate this folding operation and the coverage of the getter material 48 by the getter shield 55.

In the first embodiment of FIGS. 2-3, the getter material 48 is affixed only on the top face 52 of the getter substrate 44. The getter-shield precursor 46 is configured to overlie only the top face 52, and the getter material 48 thereon, after folding 180 degrees along a top-shield fold line 56 (FIG. 2) to define a top shield 58. The final getter assembly 40 for this first embodiment is shown in FIG. 3.

In the second embodiment of FIGS. 4-5, the getter material 48 is affixed on the top face 52 and also on the bottom face 54 of the getter substrate 44. A first portion of the getter-shield precursor 46 is configured to overlie the top face 52 and the getter material 48 thereon, after folding 180 degrees along a top-shield fold line 56 (FIG. 4) to define a top shield 58. A second portion of the getter-shield precursor 46 is configured to overlie the bottom face 54 and the getter material 48 thereon, after folding 180 degrees along a bottom-shield fold line 60 (FIG. 4) to define a bottom shield 62. The final getter assembly 40 for this second embodiment is shown in FIG. 5.

The third embodiment of FIGS. 6-7 is like that of the second embodiment of FIGS. 4-5, in that the getter material 48 is affixed to the top face 52 and to the bottom face 54, and there is a top shield 58 and a bottom shield 62. Additionally, as may be seen from FIG. 6, the getter substrate 58 has two sides 64. Two portions of the getter-shield precursor 46 are configured to overlie the sides 64, after folding 90 degrees along respective side-shield fold lines 66, relative to the top shield 58 and the bottom shield 62 (FIG. 6), to form respective side shields 68. The final getter assembly 40 for this third embodiment is shown in FIG. 7. The combination of the top shield 58, the bottom shield 62, and the side shields 68 nearly completely encloses the getter material 48 to prevent any transfer of the getter material 48 outside of the getter assembly 40. However, the use and length of the side shields 68 is optional, because the presence of the side shields may impede the movement of gas molecules to be gettered to the getter material 48 in service in some cases, thereby impeding the functioning of the getter assembly 40. This side-shield approach, while illustrated for the case of getter material 48 on both the top face 52 and the bottom face 54, may also be used wherein getter material is applied to only one of the faces 52, 54, that is, adding a single side shield to the embodiment of FIGS. 2-3.

The getter assembly produced in step 20 is typically used in a larger structure, as in the preferred approach of steps 28-32 and illustrated in FIG. 8. A vacuum housing 70 and a device 72, preferably an electronic device such as a light-sensor device, are provided, step 28. In the illustrated case, the vacuum housing 70 has a sidewall structure 74 and a window 76. The getter assembly 40 and the device 72 are inserted into an interior of the vacuum housing 70, step 30. Electrical feedthroughs 78 are provided for the getter assembly 40, and electrical feedthroughs 80 are provided for the device 72, and are connected. The vacuum housing 70 is then sealed and evacuated, step 32, with either the sealing occurring first or the evacuating occurring first, according to the specific structure of the vacuum housing. The getter material 48 is activated by passing an electrical current through the getter base 42 (via the tabs 50) to heat the getter material 48 to the required activation temperature. The activation of the getter material 48 may be performed at any operable point of the sealing and evacuation of the vacuum housing.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of preparing a structure, comprising the steps of:
   preparing a getter assembly, wherein the step of preparing includes the steps of
      furnishing a single-piece getter base including a getter substrate and a getter-shield precursor,
      affixing a getter material to the getter substrate, and
      processing the getter-shield precursor to form a getter shield;
   providing a vacuum housing and a device as a light sensor;
   inserting the getter assembly and the device into the vacuum housing; and
   sealing and evacuating the vacuum housing with the getter assembly therein.

2. The method of claim 1, wherein the step of furnishing includes the step of
   providing the getter base as a unitary structure formed of a single piece of material.

3. The method of claim 1, wherein the step of processing includes the step of
   deforming the getter-shield precursor to form the getter shield.

4. The method of claim 1, wherein the step of processing includes the step of
   folding at least a portion of the getter-shield precursor to overlie the getter material affixed to the getter substrate.

5. The method of claim 1, wherein the step of furnishing includes the step of
   furnishing the getter substrate in the form of a sheet of material having a top face and a bottom face, and wherein the step of affixing includes the step of
   affixing the getter material on only the top face of the getter substrate, and
   wherein the step of processing is commenced after the step of affixing is completed and includes the step of
   mechanically folding a top-shield portion of the getter-shield precursor through 180 degrees to overlie the getter material on the top face.

6. The method of claim 1, wherein the step of furnishing includes the step of
   furnishing the getter substrate in the form of a sheet of material having a top face and a bottom face, and wherein the step of affixing includes the step of
   affixing the getter material on both the top face and the bottom face of the getter substrate, and wherein the step of processing is commenced after the step of affixing is completed and includes the step of
   mechanically folding a top-shield portion of the getter-shield precursor through 180 degrees to overlie the getter material on the top face and a bottom-shield portion of the getter-shield precursor to overlie the getter material on the bottom face.

7. The method of claim 1, wherein the step of furnishing includes the step of
   furnishing the getter substrate in the form of a sheet of material having a top face, a bottom face, and a side, and wherein the step of affixing includes the step of
   affixing the getter material on at least one of the top face and the bottom face of the getter substrate, and wherein the step of processing is commenced after the step of affixing is completed and includes the step of
   mechanically folding a side-shield portion of the getter-shield precursor through 90 degrees to overlie the side.

8. The method of claim 1, wherein the step of affixing includes the steps of
   screen printing the getter material, or
   sintering the getter material, or
   sputtering the getter material.

9. The method of claim 1, wherein the step of affixing includes the step of
   providing a getter material that is activatable by heating the getter material to an activation temperature.

10. A method for preparing a structure, comprising the steps of:
    preparing a getter assembly, wherein the step of preparing includes the steps of
       furnishing a single-piece getter base as a unitary structure formed of a single piece of material, wherein the getter base includes a getter substrate and a getter-shield precursor,
       affixing a getter material to the getter substrate, and thereafter
       processing the getter-shield precursor to form a getter shield, wherein the step of processing includes the step of folding at least a portion of the getter-shield precursor to overlie the getter material affixed to the getter substrate;
    providing a vacuum housing and a light-sensor device;
    inserting the getter assembly and the device into the vacuum housing;
    sealing and evacuating the vacuum housing; and
    passing an electrical current through the getter base to heat the getter material to an activation temperature.

11. The method of claim 10, wherein the step of furnishing includes the step of
    furnishing the getter substrate in the form of a sheet of material having two faces.

12. The method of claim 10, wherein the step of furnishing includes the step of furnishing the getter substrate in the form of a sheet of material having a top face and a bottom face, and wherein the step of affixing includes the step of affixing the getter material on only the top face of the getter substrate, and wherein the step of processing is commenced after the step of affixing is completed and includes the step of mechanically folding a top-shield portion of the getter-shield precursor to overlie the getter material on the top face.

13. The method of claim 10, wherein the step of furnishing includes the step of furnishing the getter substrate in the form of a sheet of material having a top face and a bottom face, and wherein the step of affixing includes the step of affixing the getter material on both the top face and the bottom face of the getter substrate, and wherein the step of processing is commenced after the step of affixing is completed and includes the step of mechanically folding a top-shield portion of the getter-shield precursor to overlie the getter material on the top face and a bottom-shield portion of the getter-shield precursor to overlie the getter material on the bottom face.

14. The method of claim 10, wherein the step of furnishing includes the step of furnishing the getter substrate in the form of a sheet of material having a top face, a bottom face and a side, and wherein the step of affixing includes the step of affixing the getter material on at least one of the top face and bottom face of the getter substrate, and wherein the step of processing is commenced after the step of affixing is completed and includes the step of mechanically folding a side-shield portion of the getter-shield precursor to overlie the side.

15. The method of claim 10, wherein the step of affixing includes the steps of screen printing the getter material, or sintering the getter material, or sputtering the getter material.

16. A structure comprising a getter assembly having a single-piece getter base including a getter substrate region and a getter shield region, a getter material that is activatable by heating to an activation temperature affixed to the getter substrate region, a getter shield integral with the getter substrate and folded to overlie at least a portion of the getter material on the substrate;

a vacuum housing, wherein the getter assembly is sealed in an interior of the vacuum housing under vacuum; and a light-sensor device sealed in the interior of the vacuum housing under vacuum.

* * * * *